(12) United States Patent
Hughes

(10) Patent No.: US 7,106,106 B2
(45) Date of Patent: Sep. 12, 2006

(54) CLOCKED COMPARATOR CIRCUIT

(75) Inventor: John B. Hughes, Hove (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 59 days.

(21) Appl. No.: 10/515,688

(22) PCT Filed: May 21, 2003

(86) PCT No.: PCT/IB03/02245

§ 371 (c)(1),
(2), (4) Date: Nov. 24, 2004

(87) PCT Pub. No.: WO03/100975

PCT Pub. Date: Dec. 4, 2003

(65) Prior Publication Data

US 2005/0242844 A1    Nov. 3, 2005

(30) Foreign Application Priority Data

May 29, 2002  (GB) ................................. 0212327.1

(51) Int. Cl.
*H03K 5/22* (2006.01)
(52) U.S. Cl. ............................ 327/63; 327/64; 327/94

(58) Field of Classification Search ...................... None
See application file for complete search history.

(56) References Cited

U.S. PATENT DOCUMENTS

| | | | | |
|---|---|---|---|---|
| 4,710,724 A | * | 12/1987 | Connell et al. ................. 330/9 |
| 5,525,920 A | * | 6/1996 | Rakers et al. .................. 327/65 |
| 5,986,599 A | * | 11/1999 | Matsuo ........................ 341/158 |
| 6,150,851 A | * | 11/2000 | Ohmi et al. ................... 327/91 |

* cited by examiner

*Primary Examiner*—Timothy P. Callahan
*Assistant Examiner*—An T. Luu
(74) *Attorney, Agent, or Firm*—Adam L. Stroud

(57) ABSTRACT

A comparator is provided that compares one or more input signals in a regenerative circuit. One or more switched isolate the signal inputs after regeneration has started but before regeneration has reached such an extent that large voltage swings in the regeneration circuit are transmitted back to the signal source and corrupt the signal source or neighboring circuits. Furthermore, as controlled by a control circuit, the instant of isolating the signal source can be dependent on the degree of regeneration such as being dependent on a predetermined degree of regeneration. The comparator may be incorporated in an electronic device such as an analog-to-digital converter or a wireless receiver or transceiver.

6 Claims, 5 Drawing Sheets

CLOCKED COMPARATOR CIRCUIT

The invention relates to a comparator and an electronic device incorporating a comparator, for example, an analogue-to-digital converter (ADC) or wireless transceiver, and in particular, but not exclusively, to a comparator and electronic device suitable for implementation using switched-current electronic circuit techniques.

In the field of wireless communications, in order to increase the level of circuit integration and to reduce power consumption, it is desirable to implement wireless transceivers in mixed analogue and digital integrated circuits (ICs), and to implement such mixed signal ICs in a low voltage digital CMOS process. Switched-current circuit techniques are particularly well suited to implementation in low voltage, low power CMOS.

Comparators are used in many electronic circuits, for example in non-linear signal processing circuits. In particular, switched-current comparators are used in Analogue-to-Digital Converters (ADCs). Such an ADC can form the interface between the analogue and digital portions of a mixed signal IC.

In a current-mode ADC, a switched-current comparator must accurately sense the polarity of an input current and produce a corresponding digital output. Such a prior art comparator, simplified for ease of description, is shown in FIG. 1. A complete off-set cancelled comparator is described in "Speed and Accuracy Enhancement Techniques for High Performance Switched-Current Comparators", A. Worapishet et al, IEEE Jnl. of Solid-State Circuits, Vol. 36, No. 4, Apr. 2001. Referring to FIG. 1, the comparator comprises two transconductors connected in a positive feedback loop, having complementary MOS transistor (MOST) pairs $P_a$, $N_a$, $P_b$ and $N_b$ giving transconductances $G_m$, and a switch S with on-resistance $R_{on}$. In practice the switch S is implemented using a further MOST. When the switch S is closed, and with an input signal current $I_{sig}$ flowing into the comparator, the voltage across the switch S is $$V_{on} = \frac{I_{sig}}{\frac{1}{R_{on}} - \frac{G_m}{2}}.$$

The loop is stable provided $$R_{on} \leq \frac{2}{G_m}.$$

When the switch S is closed the comparator is reset, i.e. all memory of the comparator's previous state is removed. When the switch S is opened, the condition for stability no longer holds and the voltage $V_{on}$ is amplified regeneratively in a direction determined by the initial polarity of $V_{on}$ until the drain voltages at nodes A and B reach the supply rail voltages $V_{ss}$ and $V_{dd}$. The speed of regeneration is dependent on the size of the input current. Small input currents produce slow regeneration and large input currents produce rapid regeneration.

One problem with such a prior art comparator is the phenomenon termed "kickback" which can limit the accuracy of signal processing and the performance of devices incorporating the comparator. Kickback occurs when large voltage swings at the drain nodes A and B are transmitted back to the signal source, thereby corrupting the signal either by directly disturbing the signal source itself or by crosstalk through parasitic paths to neighbouring circuits.

One solution to kickback disclosed by J. B. Hughes et al in "A Low Voltage 8-bit 40 MS/s Switched-Current Pipeline Analog-to-Digital Converter", Digest of 2001 International Symposium on Circuits and Systems, W11-Aud1-0.2, 2001, is to employ extra memories to improve isolation, but this is at the expense of increased power consumption, increased chip area, and, because it necessitates architectural changes, reduced conversion speed of an ADC which uses the comparator.

An objective of the present invention is to provide an improved comparator. Another objective of the present invention is to provide an improved device incorporating a comparator.

According to a first aspect of the invention there is provided a comparator comprising first and second inputs for signals to be compared, regenerative means for comparing during a first period signals applied to the first and second inputs, means for resetting the regenerative means in a second period, and decoupling means for decoupling in the first period the first and second inputs from the regenerative means during regeneration but before regeneration is complete.

By decoupling the inputs from the regenerative means before regeneration is complete, large voltage swings a reprevented from reaching the inputs or the signal source, and the likelihood of disturbing neighbouring circuits by cross talk is reduced.

Because the speed of regeneration is dependent on the size of the input current, the optimum instant for performing the decoupling can depend on the magnitude of the signal to be compared. For example, for small signals, regeneration is slow and the optimum instant for decoupling while still ensuring reliable regeneration is later than for large signals. Decoupling at the optimum instant for small signals may result in reduced protection from kickback with large signals where regeneration is faster. Conversely, decoupling at the optimum instant for large signals may result in unreliable regeneration with small signals. Therefore, further improvement is possible by making the instant of decoupling dependent on the degree of regeneration.

One way of making the instant of decoupling dependent on the degree of regeneration is to measure the degree of regeneration and to decouple the inputs when the degree of regeneration reaches a predetermined value. The invention provides protection from kickback but with lower power consumption, smaller chip area and faster operation than the prior art disclosed by Hughes et al.

According to a second aspect of the invention there is provided an electronic device incorporating the comparator of the first aspect of the invention. The electronic device may be, for example, an analogue-to-digital converter or an electronic device having an analogue-to-digital converter.

The invention will now be described, by way of example, with reference to the accompanying drawings wherein.

Figure 1:
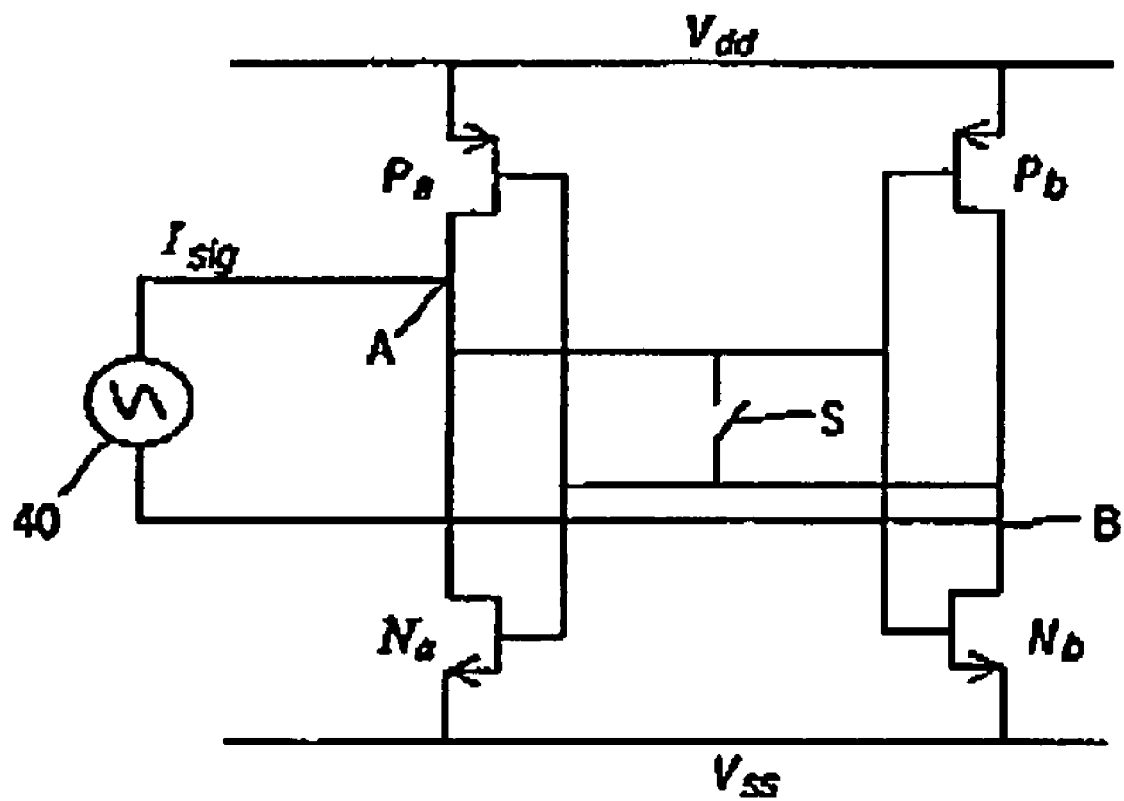
FIG. 1 is a schematic circuit diagram of a prior art comparator described above.
Figure 2:
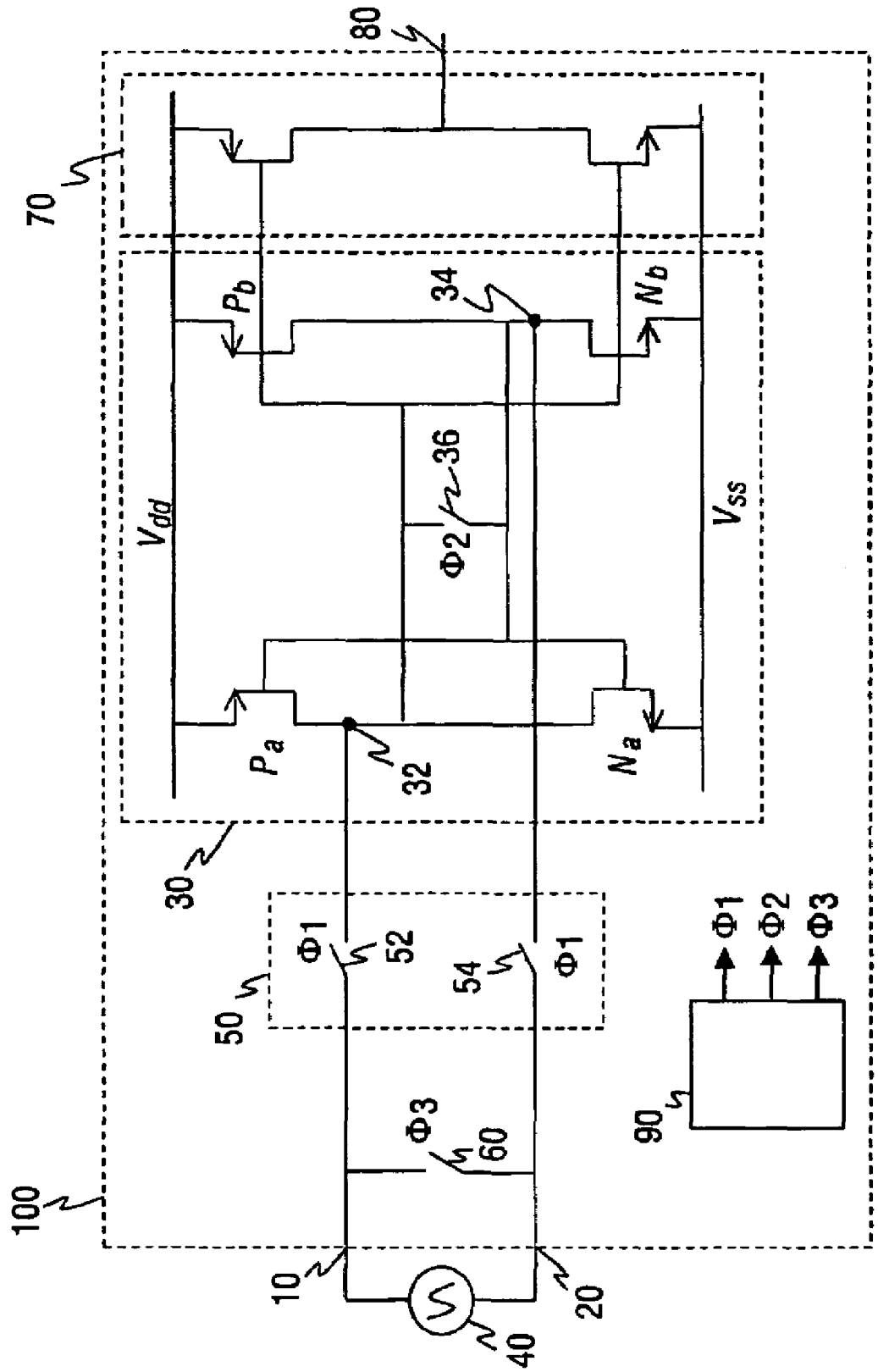
FIG. 2 is a schematic circuit diagram of a first embodiment of a comparator.

Referring to FIG. 2 there is a comparator 100 having a first input 10, a second input 20, and a regenerative means 30 having a first node 32 and a second node 34. An input signal source 40 is coupled between the first and second inputs 10, 20. The first and second inputs 10, 20 are coupled to, respectively, the first and second nodes 32, 34 by decoupling means 50 which comprises first and second decoupling switches 52, 54.

The regenerative means 30 comprises a first transconductor consisting of complementary MOS transistors $P_a$ and $N_a$ with their drains coupled at the first node 32, and their gates coupled together and also to the second node 34, and a second transconductor consisting of complementary MOS transistors $P_b$ and $N_b$ with their drains coupled at the second node 34, and their sources coupled together and also to the first node 32. There is a reset switch 36 coupled between the first and second nodes 32, 34. There is a bypass switch 60 coupled between the first and second inputs 10, 20 which provides a current path for the input signal current when the inputs 10, 20 are decoupled from the regenerative means 30.

The comparator 100 has an output stage 70 to provide a single ended output 80. The output stage 70 comprises a complementary pair of MOS transistors with their gates coupled to respective gates of the second transconductor. The output 80 is coupled to the junction of the complementary MOS transistors of the output stage 70. Alternative output stages are possible and can be devised readily by a skilled person.

The comparator 100 has a clock generator 90 which generates three switching signals; a decoupling signal $\Phi_1$, a reset signal $\Phi_2$, and a bypass signal $\Phi_3$. These switching signals $\Phi_1$, $\Phi_2$, and $\Phi_3$ control the opening and closing of the switches as described below.

Figure 3:
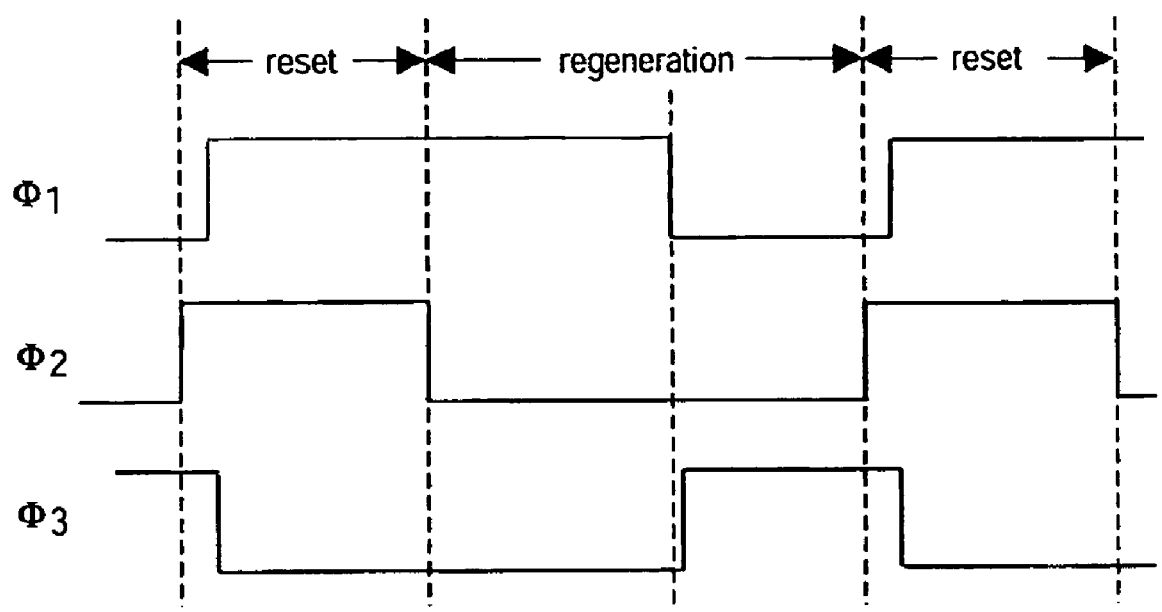
FIG. 3 is a timing diagram.

FIG. 3 illustrates the timing of the switching signals $\Phi_1$, $\Phi_2$, and $\Phi_3$. A reset period and a regeneration period alternate. In FIG. 3, a high level switching signal corresponds to a closed switch and a low level corresponds to an open switch. The reset signal $\Phi_2$ maintains the reset switch 36 closed throughout the reset period, thereby coupling together the first and second nodes 32, 34, and opens the reset switch 36 throughout the regeneration period, thereby decoupling the first and second nodes 32, 34. The decoupling signal $\Phi_1$ closes the decoupling switches 52, 54, thereby coupling the first and second inputs 10, 20 to, respectively, the first and second nodes 32, 34, soon after the reset period has started, and opens the decoupling switches 52, 54 after regeneration has started but before regeneration is complete. The bypass signal $\Phi_3$ doses the bypass switch 60 soon after the decoupling switches 52, 54 have been opened and opens it soon after the decoupling switches 52, 54 have been closed.

In operation, the input signal source 40 supplies a current $I_{sig}$ to the comparator. While the reset switch 36 is closed the voltage across the reset switch is $$V_{on} = \frac{I_{sig}}{\frac{1}{R_{on}} - \frac{G_m}{2}}$$

where $R_{on}$ is the on-resistance of the reset switch 36 and $G_m$ is the transconductance of each of the first and second transconductors. When the reset switch 36 is opened the regeneration period starts and the voltage $V_{on}$ across the reset switch 36 is amplified regeneratively in a direction determined by the initial polarity of $V_{on}$ until the voltages at the first and second nodes 32, 34 reach one or other of the supply rail voltages, $V_{ss}$ and $V_{dd}$. After regeneration has started, but at a predetermined instant before regeneration is complete, that is before the voltage at the first and second nodes 32, 34 reach the supply rail voltages, the decoupling signal $\Phi_1$ opens the decoupling switches 52, 54, thereby isolating the first and second inputs 10, 20, and therefore the input signal source 40, from the kickback effect of large voltage swings at the first and second nodes 32, 34.

Figure 4:
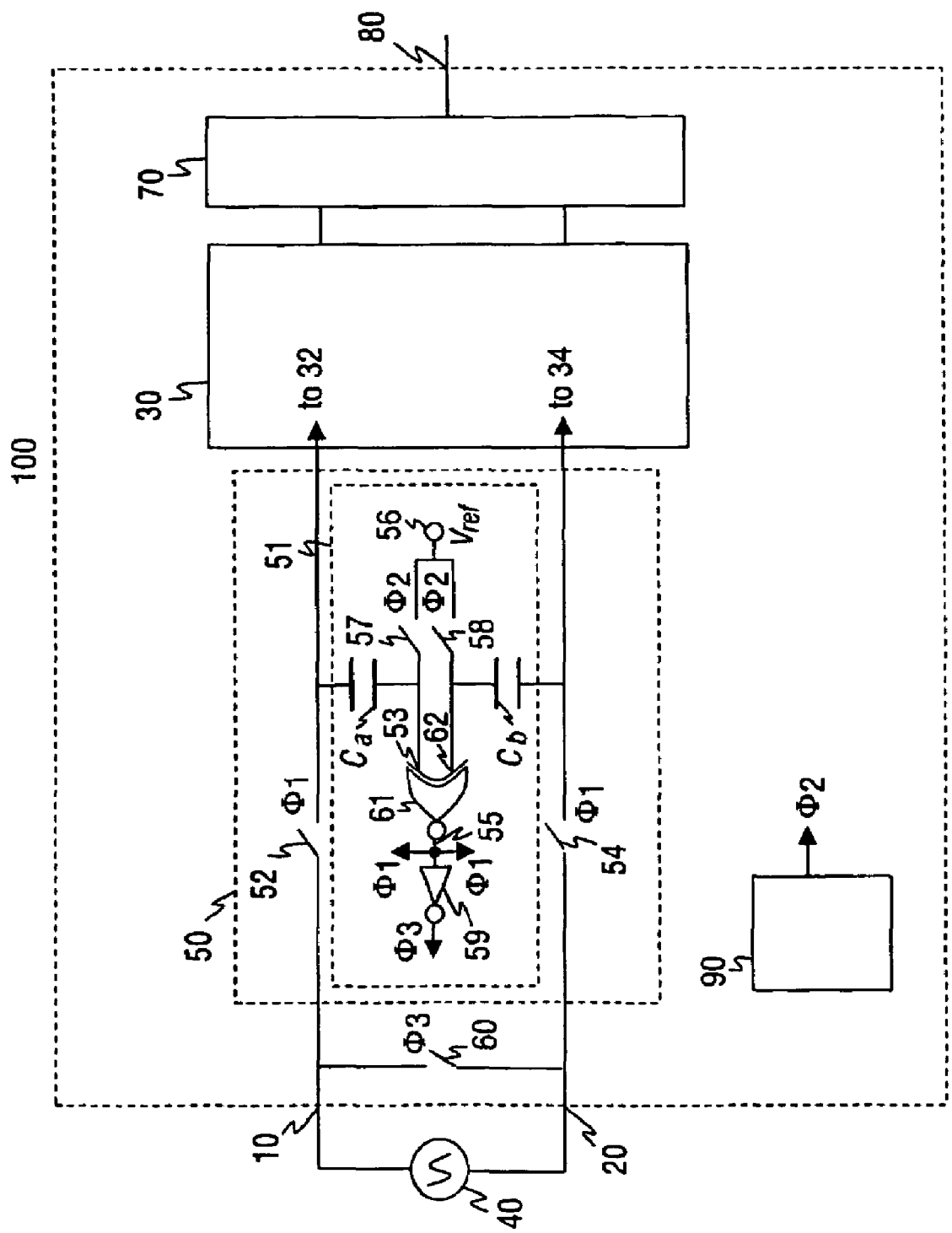
FIG. 4 is a schematic circuit diagram of a second embodiment of a comparator.

A second embodiment of the invention is illustrated in FIG. 4. This second embodiment is the same as the first embodiment described above, except that the decoupling signal $\Phi_1$ and the bypass signal $\Phi_3$ are not generated by the clock generator 90 but instead by a control means 51. The control means 51 is arranged to monitor the degree of regeneration and to open the decoupling switches 52, 54 when the degree of regeneration reaches a predetermined value. The control means 51 comprises a gate means 61 providing a NOR function. The gate means 61 has first and second gate inputs 53, 62 and a gate output 55. The first and second gate inputs 53, 62 are coupled to, respectively, the first and second nodes 32, 34 of the regenerative means 30 by means of respective first and second capacitors $C_a$ and $C_b$. The first and second gate inputs 53, 62 are also coupled to a voltage reference source 56 by means of respective first and second reference switches 57, 58. The first and second reference switches 57, 58 are under the control of the reset signal $\Phi_2$, and are closed throughout the reset period and open throughout the regeneration period. The gate output 55 provides the decoupling signal $\Phi_1$ and an inverter 59 inverts and slightly delays the decoupling signal $\Phi_1$ to provide the bypass signal $\Phi_3$. The voltage $V_{ref}$ of the voltage reference source 56 is below the switching threshold of the gate means 52.

In operation, during the reset period the first and second gate inputs 53, 54 are forced to voltage $V_{ref}$ and the first and second capacitors $C_a$ and $C_b$ charge to the difference voltages between $V_{ref}$ and the voltages at, respectively, the first and second nodes 32, 34. Because $V_{ref}$ is below the switching threshold of the gate means 61, the gate output 55 is high, resulting in the decoupling switches 52, 54 being closed, thereby coupling the first and second inputs to, respectively, the first and second nodes 32, 34.

At the end of the reset period the first and second reference switches 57, 58 are opened thereby isolating the first and second gate inputs 53, 62 from the voltage reference source 56, but instantaneously the voltages at the first and second gate inputs 53, 62 are held at voltage $V_{ref}$ by the charge on the first and second capacitors $C_a$ and $C_b$, so the decoupling signal $\Phi_1$ stays high and the first and second inputs 10, 20 remain coupled to the first and second nodes 32, 34. As regeneration ensues the voltages at the first and second nodes 32, 34 move towards the supply rail voltages, one to $V_{ss}$ and the other to $V_{dd}$, depending on the polarity of the input signal current $I_{sig}$, and the voltage changes at the first and second nodes 32, 34 are transmitted to, respectively, the first and second gate inputs 53, 62, via, respectively, the first and second capacitors $C_a$ and $C_b$. When either of the voltages at the first and second gate inputs 53, 62 goes above the switching threshold of the gate means 61, the voltage at the gate output 55 goes low, thereby causing the decoupling signal $\Phi_1$ to open the decoupling switches 52, 54 and isolating the inputs 10, 20 from the first and second nodes 32, 34. In this way, the direction of regeneration is established reliably but the signal source is isolated before regeneration has reached damaging proportions.

All switches in both embodiments of the comparator are implemented as MOS transistors.

Figure 5:
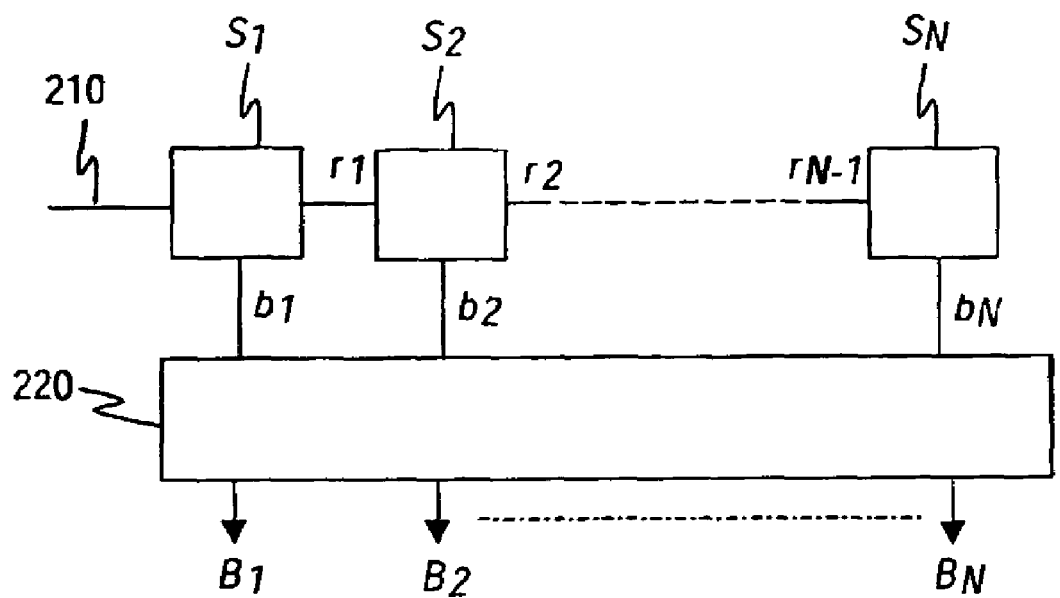
FIG. 5 illustrates the architecture of an N-bit switched current ADC.
Figure 6:
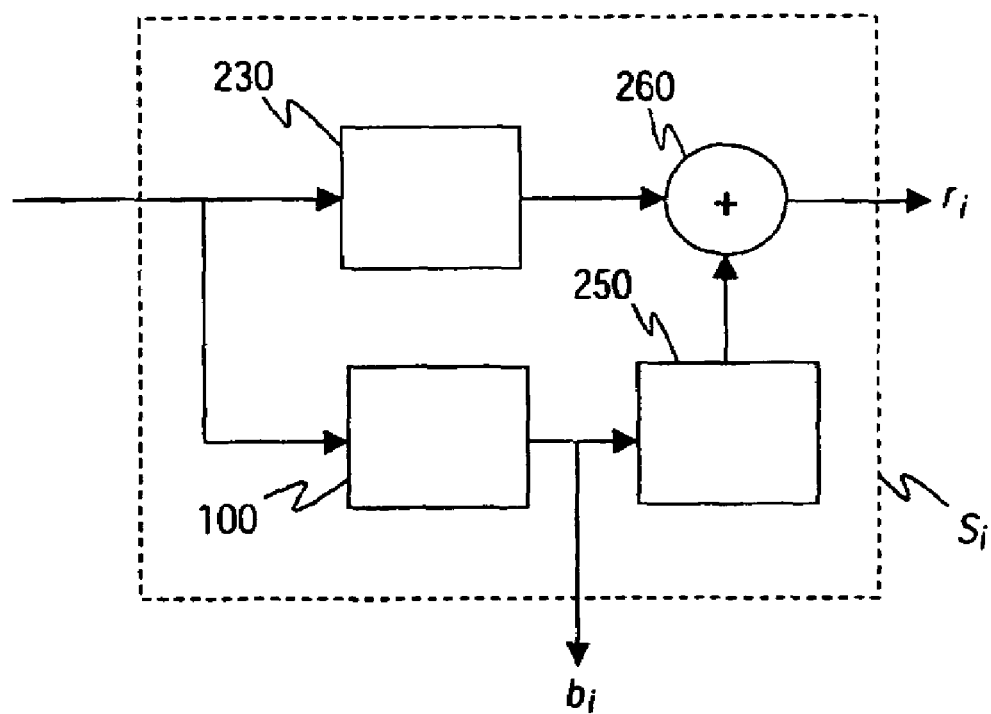
FIG. 6 illustrates the architecture of a conversion stage of the ADC of FIG. 5.

Referring to FIG. 5 there is illustrated the general architecture of a typical N-bit switched current pipeline ADC incorporating the comparator 100. It comprises an analogue current input 210 and N cascaded conversion stages $S_1 \ldots S_N$. Each stage generates one bit $b_1 \ldots b_N$ and, except for the last stage, an analogue residue current $r_1 \ldots r_{N-1}$, which is passed to the following stages for conversion. De-skew logic 220 is used to re-time the bits to provide digital outputs $B_1 \ldots B_N$. The general architecture of each conversion stage, except the last, is illustrated in FIG. 6 and comprises a current memory, implemented using a sample-and-hold (S/H) circuit 230, the current comparator 100 for generating one bit $b_i$, a current digital-to-analogue converter (DAC) 250 and a summer 260 for generating the residue as the difference between the input current, as delivered via the current memory 230, and the current delivered by the DAC 250. The last conversion stage has only a current comparator as no residue is required.

In the present specification and claims the word "a" or "an" preceding an element does not exclude the presence of a plurality of such elements. Further, the word "comprising" does not exclude the presence of other elements or steps than those listed.

The invention claimed is:

1. A comparator comprising:
   first and second inputs for signals to be compared;
   regenerative means for comparing during a first period signals applied to the first and second inputs;
   means for resetting the regenerative means in a second period;
   decoupling means for decoupling in the first period the first and second inputs from the regenerative means during regeneration but before regeneration is complete; and
   control means responsive to the degree of regeneration for controlling the instant of decoupling the first and second inputs from the regenerative means.

2. A comparator as claimed in claim 1, wherein the control means is responsive to a predetermined degree of regeneration.

3. A comparator as claimed in claim 2, wherein the control means comprises a gate means having first and second gate inputs, the first gate input being coupled by means of a first capacitor to a first node of the regenerative means and also, during the second period, to a reference voltage source, and the second gate input being coupled by means of a second capacitor to a second node of the regenerative means and also, during the second period, to the reference voltage source, wherein the reference voltage is below a switching threshold of the gate means, and wherein voltages at the first and second nodes are driven in opposite directions during regeneration, the gate means further comprising a gate output coupled to the decoupling means to cause decoupling of the first and second inputs from the regenerative means when a voltage at either the first or second gate inputs exceeds the switching threshold of the gate means.

4. A comparator as claimed in claim 1, wherein the regenerative means comprises first and second transconductors coupled in a positive feedback loop.

5. A comparator as claimed in claim 4, wherein the first and second transconductors each comprise a complementary pair of MOS transistors.

6. A comparator as claimed in claim 5, wherein the first node is the drain junction between the complementary MOS transistors of the first transconductor and the second node is the drain junction between the complementary MOS transistors of the second transconductor.

* * * * *